United States Patent [19]

Lee

[11] Patent Number: 5,350,715
[45] Date of Patent: Sep. 27, 1994

[54] CHIP IDENTIFICATION SCHEME

[75] Inventor: Wui-soo Lee, Kyungki, Rep. of Korea

[73] Assignee: Samsung Electronics Co., Ltd., Kyungki, Rep. of Korea

[21] Appl. No.: 974,423

[22] Filed: Nov. 12, 1992

[30] Foreign Application Priority Data

Nov. 12, 1991 [KR] Rep. of Korea .................... 91-20034

[51] Int. Cl.$^5$ ............................................. H01L 21/00
[52] U.S. Cl. ........................................ 437/250; 437/7; 437/8; 437/924; 437/935
[58] Field of Search .................. 437/250, 8, 7, 935, 437/924; 148/DIG. 162

[56] References Cited

U.S. PATENT DOCUMENTS 5,219,765  6/1993  Yoshida et al. ............ 148/DIG. 162

FOREIGN PATENT DOCUMENTS

| | | | |
|---|---|---|---|
| 58-50728 | 3/1983 | Japan | 437/924 |
| 58-50729 | 3/1983 | Japan | 437/924 |
| 51513 | 3/1983 | Japan | 437/924 |
| 62-47142 | 2/1987 | Japan | 437/924 |
| 14040 | 1/1989 | Japan | 437/924 |
| 2312238 | 12/1990 | Japan | 437/935 |

*Primary Examiner*—Tom Thomas
*Assistant Examiner*—Kevin M. Picardat
*Attorney, Agent, or Firm*—Robert A. Westerlund; Stephen R. Whitt; Charles R. Donohoe

[57] ABSTRACT

A method for determining the original location of each of a multiplicity of semiconductor chips fabricated on a common wafer, including the step of applying location identification data to each of the chips, wherein the location identification data is indicative of the original location of the chip on the wafer. The applying step is preferably performed during the process for fabricating the chips on the wafer, for example, by means of using a photomask in a conventional photolithographic process to etch a location identification mark on a predetermined layer of each chip. The location identification mark can be, for example, a dot matrix pattern which signifies the original location of the chip to which it is affixed on the wafer on which it was fabricated, in accordance with a binary coding scheme. The location identification data can be detected or read from any of the chips even after they are separated from the wafer, to thereby facilitate wafer fabrication process control, by facilitating the determination of the original wafer location of any chips which are found to be defective.

8 Claims, 1 Drawing Sheet

FIG. 1A
|  | 1 | 2 | 4 | 8 |
|---|---|---|---|---|
| 100×DIGIT | ● |  |  |  |
| 10 ×DIGIT | ● |  |  | ● |
| 1 ×DIGIT |  | ● | ● |  |
| REFERENCE ROW |  | ● | ● |  |
FIG. 1B
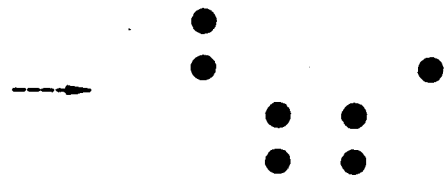
FIG. 2A
|  | 1 | 2 | 4 | 8 |
|---|---|---|---|---|
| 100×DIGIT | ● |  |  |  |
| 10 ×DIGIT | ● | ● |  |  |
| 1 ×DIGIT |  | ● |  |  |
| REFERENCE ROW |  | ● | ● |  |
FIG. 2B
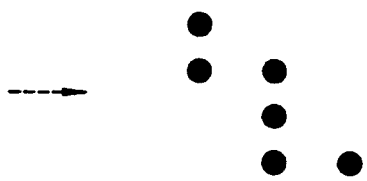
FIG. 3A
|  | 1 | 2 | 4 | 8 |
|---|---|---|---|---|
| 100×DIGIT | ● | ● |  |  |
| 10 ×DIGIT | ● |  |  | ● |
| 1 ×DIGIT |  | ● | ● |  |
| REFERENCE ROW |  | ● | ● |  |
FIG. 3B
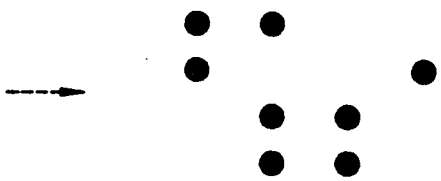

CHIP IDENTIFICATION SCHEME

BACKGROUND OF THE INVENTION

The present invention relates generally to semiconductor wafer processing, and more particularly, to a technique for identifying the original location of a semiconductor chip on the wafer on which it was fabricated, even after the chip is separated from the wafer.

In semiconductor manufacturing, a multiplicity, e.g., 200, of individual semiconductor devices, e.g., memory devices such as SRAMs and DRAMs, are fabricated on a single semiconductor wafer. The semiconductor wafer is then sliced up into a corresponding multiplicity of individual dies or chips. Thus, each individual semiconductor device is often referred to as a semiconductor chip. The cost of manufacturing such semiconductor chips is a function of the ratio of non-defective chips/total chips fabricated on a given wafer, which is defined as wafer yield. Therefore, it is important to identify chip defects as early as possible in order to provide process control information which can be used to correct wafer processing problems at the earliest possible time, to thereby maximize product quality and throughput rate, and to minimize product manufacturing costs. In order to optimize process control, it is not only necessary to identify the existence of chip defects, but to also learn the nature and location of such defects so that corrective measures can be more specifically tailored to resolving the underlying wafer processing problem which led to such defect.

In this regard, it has heretofore been technically infeasible to determine the original location of a semiconductor chip on the wafer on which it was fabricated, after the chip has been separated from the wafer and packaged as a discrete product. Such information, if available, would provide more meaningful feedback to the wafer processing operation, and thus, would facilitate more precise troubleshooting of wafer processing flaws.

Based on the above, it can be appreciated that there presently exists a need for a method for determining the original location of a semiconductor chip on a wafer on which it was fabricated, after the chip is separated from the wafer. The present invention fulfills this need.

SUMMARY OF THE INVENTION

The present invention encompasses a method for determining the original location of each of a multiplicity of semiconductor chips fabricated on a common wafer, including the step of applying location identification data to each of the chips, wherein the location identification data is indicative of the original location of the chip on the wafer. The applying step is preferably performed during the process for fabricating the chips on the wafer, for example, by means of using a photomask in a conventional photolithographic process to etch a location identification mark on a predetermined layer of each chip. The location identification mark can be, for example, a dot matrix pattern which signifies the original location of the chip to which it is affixed on the wafer on which it was fabricated, in accordance with a binary coding scheme. The location identification data can be detected or read from any of the chips even after they are separated from the wafer, to thereby facilitate wafer fabrication process control, by facilitating the determination of the original wafer location of any chips which are found to be defective.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIGS. 1A, 2A, and 3A diagramatically depict three different masks used in the method of the present invention for applying three respective location identification marks to three respective semiconductor chips fabricated on a common wafer; and, FIGS. 1B, 2B, and 3B depict the three respective location identification marks applied to the three respective semiconductor chips by means of using the three different masks depicted in FIGS. 1A, 2A, and 3A, respectively.

DETAILED DESCRIPTION OF THE INVENTION

The present invention, in its broadest sense, encompasses a method for marking a plurality of individual semiconductor chips fabricated on a common semiconductor wafer with an identification mark which is representative of the location of the respective chip on the semiconductor wafer. In this regard, the location identification marks can be considered chip addresses. The particular type of location identification mark which is used and the manner of applying the identification mark to each of the chips is not limiting to the present invention, in its broadest sense. However, a particular location identification code and marking scheme are described below, for purposes of illustrating an exemplary embodiment of the present invention which is presently preferred.

More particularly, with reference now to FIGS. 1A, 2A, and 3A, there can be seen diagrammatic representations of 1X E-beam direct master masks which are employed, in accordance with a presently preferred embodiment of the present invention, to facilitate application of three different coded location identification marks to three different semiconductor chips (not shown), respectively, fabricated on a common semiconductor wafer (not shown).

In accordance with the specific coding scheme utilized, a matrix of dots are provided, comprised of four rows and four columns. The four columns represent, from left to right, the binary numbers $2^0=1, 2^1=2, 2^2=4$, and $2^3=8$, respectively, and the three uppermost rows represent, from top to bottom, the decimal numbers $10^2=100, 10^1=10$, and $10^0=1$, respectively. The fourth, or lowermost row, is a reference row whose purpose will become apparent hereinafter. The total coded value of each row is determined by multiplying the row value of that row by the sum of the column values of the columns in that row where an indicia, e.g., a dot, is present. In this regard, the presence of an indicia at the intersection of a row and a column can be considered a "1" bit, and the absence of an indicia at the intersection of a row and a column can be considered a "0" bit.

For example, the first, or uppermost row of the dot matrix mask depicted in FIG. 1A has a total coded value of $100 \times 1 = 100$. The second row of that mask has a total coded value of $10 \times (1+8) = 90$. The third row of that mask has a total coded value of 1×(2+4)=6. The total coded value of the entire dot matrix mask depicted in FIG. 1A is the sum of the total coded row values, i.e., 100+90+6=196. This total coded value is representative of the original location of the individual chip marked with this particular dot matrix pattern, on the semiconductor wafer on which it was fabricated, even after the chip is separated from the wafer. Similarly, the total coded value of the entire dot matrix mask depicted in FIG. 2A is 100+30+2=132, and the total coded value of the entire dot matrix mask depicted in FIG. 3A is 300+90+6=396.

In accordance with the presently preferred embodiment of the present invention, the above-described dot matrix patterns are applied to three different individual chips fabricated on a common semiconductor wafer by means of using the direct master masks depicted in FIGS. 1A, 2A, and 3A, in a standard photolithographic process during wafer fabrication, to etch a corresponding matrix pattern of contact holes in a specified layer of the respective chips (i.e., the semiconductor device), as is depicted in FIGS. 1B, 2B, and 3B. It should be recognized that each contact hole is preferably of very small size, e.g., 5μ×5μ, and the entire matrix pattern of contact holes, i.e., the location identification code, formed in each semiconductor chip on the common wafer, preferably occupies only a relatively small area, e.g., a peripheral or marginal area of 50μ×50μ, of the chip. It should also be recognized that the location identification code is preferably affixed to the chip in a location that does not adversely affect the device characteristics thereof. Of course, the particular dimensions of the individual contact holes and the ultimate size of the location identification marks is not limiting to the present invention.

In actual practice, before applying a location identification mark to each of the individual semiconductor chips fabricated on a single semiconductor wafer, the wafer should first be mapped and a database or chart compiled correlating each location identification mark with a specific chip location on the wafer (e.g., the X-Y coordinates of each chip). For example, the chips may be numbered from 1–2000 starting from the lower left-hand corner of the wafer and counting sequentially to the upper right-hand corner of the wafer, returning to the leftmost column after counting to the end of each row. Of course, the specific numbering sequence employed is not limiting to the present invention.

Also, rather than utilizing a unique location identification mark or address for each chip to represent the exact location of the chip on the wafer, the wafer can be divided into regions or sectors and the location identification marks can be used to represent only the region or sector of the chips to which they are applied. In accordance with this scheme, each of the chips within a particular region or sector will have the same location identification mark. Of course, the degree of precision of the location identification data employed will likely influence the degree of wafer fabrication process control afforded thereby.

After the wafer mapping database or chart is compiled, and the location identification marks applied to each chip on the wafer, the chips can be separated from the wafer and packaged. When any individual chip is later checked as part of a quality inspection procedure or failure/reliability analysis, the original location of that chip on the wafer on which it was fabricated can be easily determined by means of detecting or reading the location identification mark applied thereto. It is presently contemplated that the marks can be either optically or electronically detected. For example, the marks can be optically detected by means of a scanning electron microscope or other suitable optical instrument, or electronically detected by means of a microprocessor or other electronic device programmed to decode the marks, e.g., in accordance with the previously described binary coding scheme. In any event, the particular mechanism utilized to read the location identification marks is not limiting to the present invention. In order to facilitate easier detection of the marks, it is preferred that, as is shown in FIGS. 1A, 2A, and 3A, the fourth or reference row of each location identification mark (i.e., dot matrix pattern in the preferred embodiment) is assigned the same value, thereby providing a position reference point for the mark detector mechanism utilized. Of course, if such a position alignment reference is needed, the reference row can be dispensed with.

Although a preferred embodiment of the present invention has been described in detail hereinabove, it should be clearly understood that many variations and-/or modifications of the basic inventive concepts herein taught which may appear to those skilled in the pertinent art will still fall within the spirit and scope of the present invention, as defined in the appended claims.

What is claimed is:

1. A method for determining the original location of a semiconductor chip fabricated on a wafer, comprising the step of applying a location identification mark on the chip, said location identification mark being indicative of the original location of the chip on the wafer, said location identification mark being comprised of a plurality m of rows of binary indicia and a plurality n of columns of binary indicia arranged in an m x n matrix, wherein a total coded value for said matrix is calculated by summing total row values calculated for each row by multiplying a row value assigned to that row by the sum of column values assigned to each column in that row where a "1" bit is present.

2. The method as set forth in claim 1, further comprising the step of detecting said location identification mark after the chip is separated from the wafer.

3. The method as set forth in claim 2, further comprising the step of determining the original location of the chip on the wafer in response to said detecting step.

4. The method as set forth in claim 1, wherein said applying step is performed during the process for fabricating the chip on the wafer.

5. The method as set forth in claim. 1, wherein said applying step is carried out by means of a photolithographic process performed during the process for fabricating the chip on the wafer.

6. The method as set forth in claim 5, wherein said photolithographic process is performed by means of using a photomask having a dot matrix pattern to etch a corresponding matrix pattern of contact holes in a layer of the chip.

7. The method as set forth in claim 6, wherein said corresponding matrix pattern occupies a relatively small portion of the total area of a surface of said layer of the chip.

8. The method as set forth in claim 1, wherein said patterned indicia include an additional row having a total row value which serves as a position reference for facilitating alignment of a detection means for detecting said indicia.

* * * * *